(12) United States Patent
Kim et al.

(10) Patent No.: US 7,864,140 B2
(45) Date of Patent: Jan. 4, 2011

(54) LIGHT-EMITTING DISPLAY

(75) Inventors: Yang-Wan Kim, Suwon-si (KR);
Won-Kyu Kwak, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 1025 days.

(21) Appl. No.: 11/055,474

(22) Filed: Feb. 9, 2005

(65) Prior Publication Data

US 2005/0200618 A1   Sep. 15, 2005

(30) Foreign Application Priority Data

Mar. 9, 2004   (KR) ............... 10-2004-0015858

(51) Int. Cl.
*G09G 3/30* (2006.01)
(52) U.S. Cl. .................... 345/77; 345/82
(58) Field of Classification Search ............ 345/76–83, 345/204; 315/169.3
See application file for complete search history.

(56) References Cited

U.S. PATENT DOCUMENTS

| | | | |
|---|---|---|---|
| 5,990,629 A | 11/1999 | Yamada et al. | |
| 6,229,508 B1 * | 5/2001 | Kane | 345/82 |
| 6,730,966 B2 * | 5/2004 | Koyama | 257/350 |
| 6,930,680 B2 * | 8/2005 | Miyazawa | 345/205 |
| 7,215,304 B2 * | 5/2007 | Tsuchiya et al. | 345/76 |
| 2001/0026251 A1 * | 10/2001 | Hunter et al. | 345/55 |
| 2002/0000576 A1 * | 1/2002 | Inukai | 257/202 |
| 2003/0107560 A1 | 6/2003 | Yumoto et al. | |
| 2003/0128173 A1 | 7/2003 | Ko | |
| 2003/0184238 A1 | 10/2003 | Osame et al. | |
| 2003/0231152 A1 | 12/2003 | Shin | |
| 2006/0077134 A1 * | 4/2006 | Hector et al. | 345/76 |

FOREIGN PATENT DOCUMENTS

CN   1361510 A   7/2002

(Continued)

OTHER PUBLICATIONS

Patent Abstracts of Japan, Publication No. 2003-050564, dated Feb. 21, 2003, in the name of Shin Asano.
Patent Abstracts of Japan, Publication No. 2002-082651, dated Mar. 22, 2002, in the name of Kazutaka Inukai.

(Continued)

*Primary Examiner*—Kevin M Nguyen
(74) *Attorney, Agent, or Firm*—Christie, Parker & Hale, LLP

(57) ABSTRACT

A light-emitting display device includes a pixel circuit that transmits a data signal using switches responding to control signals. The pixel circuit of the light-emitting display device includes first and second switching transistors serially coupled to a data line. A capacitor is charged with charges in response to a data signal from the data line through the first and second switching transistors. A driving transistor outputs a current corresponding to the charges in the capacitor. A light-emitting diode emits light corresponding to the current. One of the first and second switching transistors is turned on in response to a select signal from a first scan line and the other one is turned on in response to a control signal for controlling an operation of a second pixel circuit.

23 Claims, 11 Drawing Sheets

FOREIGN PATENT DOCUMENTS

| | | | |
|---|---|---|---|
| CN | 1435805 | A | 8/2003 |
| CN | 1455914 | A | 11/2003 |
| CN | 1464496 | A | 12/2003 |
| EP | 1 331 627 | A2 | 7/2003 |
| JP | 2002-82651 | | 3/2002 |
| JP | 2003-108067 | | 4/2003 |
| JP | 2003-173165 | | 6/2003 |
| JP | 2003-224461 | | 8/2003 |
| KR | 10-2004-0009285 | | 1/2004 |
| WO | WO 03/077229 | A1 | 9/2003 |

OTHER PUBLICATIONS

Patent Abstracts of Japan, Publication No. 2003-108067, dated Apr. 11, 2003, in the name of Shoichiro Matsumoto.

Patent Abstracts of Japan, Publication No. 2003-173165, dated Jun. 20, 2003, in the name of Yoshiaki Aoki.

Patent Abstracts of Japan, Publication No. 2003-224461, dated Aug. 8, 2003, in the name of Shoichiro Matsumoto.

Korean Patent Abstracts, Publication No. 1020040009285 A, dated Jan. 31, 2004, in the name of O Gyeong Kwon.

* cited by examiner

LIGHT-EMITTING DISPLAY

CROSS REFERENCE TO RELATED APPLICATION

This application claims priority to and the benefit of Korea Patent Application No. 10-2004-0015858 filed on Mar. 9, 2004 in the Korean Intellectual Property Office, the entire content of which is incorporated herein by reference.

BACKGROUND OF THE INVENTION (a) Field of the Invention

The present invention relates to a display device, and more specifically, to an organic electroluminescence (EL) display using electroluminescence of an organic material.

(b) Description of the Related Art

An organic EL display is a display device that electrically excites a fluorescent organic compound to emit light. The organic EL display drives N×M organic light-emitting cells arranged in a matrix form with voltage or current to display images. An organic light-emitting cell of the organic EL display has a diode characteristic, so it can also be referred to as an organic light-emitting diode (OLED). Referring to FIG. 1, the organic light-emitting cell includes an anode (ITO), a multi-level organic thin film, and a cathode (metal). The multi-level organic thin film includes an emitting layer (EML), an electron transport layer (ETL), and a hole transport layer (HTL) to improve light emission efficiency. In addition, the organic thin film further includes an electron injecting layer (EIL) and a hole injecting layer (HIL). M×N organic light-emitting cells each of which has the aforementioned structure are arranged in a matrix form to construct an organic EL display panel.

A method of driving the organic EL display panel can be classified as either a passive matrix method or an active matrix method using thin film transistors (TFTs). The passive matrix method forms anodes and cathodes in an intersecting manner and selects a line to drive the organic EL display panel. The active matrix method couples a TFT to each ITO pixel electrode and drives the organic EL display panel based on a voltage sustained by capacitance coupled to the gate of the TFT.

FIG. 2 shows a conventional active matrix organic EL display using TFTs. Referring to FIG. 2, the organic EL display includes an organic EL display panel 100, a scan driver 200, and a data driver 300. The organic EL display panel 100 includes a plurality of data lines D1 through Dm arranged in a row direction, a plurality of scan lines S1 through Sn arranged in a column direction, and a plurality of pixel circuits 110. The data lines D1 through Dm transmit a data signal representing a video signal to the pixel circuits 110, and the scan lines S1 through Sn transmit a select signal to the pixel circuits 110. Each pixel circuit 110 is formed at a pixel region defined by two data lines and two scan lines adjacent to the pixel region.

The scan driver 200 sequentially applies the select signal to the scan lines S1 through Sn and the data driver 300 supplies a data voltage corresponding to a video signal to the data lines D1 through Dm.

The scan driver 200 and/or data driver 300 can be coupled to the display panel 100 or mounted in chip form on a tape carrier package (TCP) attached to the display panel 100 and coupled thereto. Furthermore, the scan driver 200 and/or data driver 300 can be mounted in chip form on a flexible printed circuit (FPC) or a film attached to the display panel 100 and coupled thereto. Alternatively, the scan driver 200 and/or data driver 300 can be directly mounted on a glass substrate of the display panel 100. In addition, the scan driver 200 and/or data driver 300 can be directly mounted on the glass substrate such that it can replace driving circuits formed of the same layers of the scan lines, data lines, and TFTs.

FIG. 3 is a circuit diagram of one of the M×N pixel circuits (or cells) of the display panel 100 shown in FIG. 2. Referring to FIG. 3, the pixel circuit includes an organic EL diode OLED, two transistors including a switching transistor SM and a driving transistor DM, and a capacitor Cst. The transistors SM and DM are PMOS transistors.

The driving transistor DM has a source coupled to a power supply voltage Vdd. The capacitor Cst is coupled between the gate and source of the driving transistor DM. The capacitor Cst sustains a gate-source voltage (e.g., VGS) of the driving transistor DM for a predetermined period of time. The switching transistor SM transmits a data voltage from the data line Dm to the driving transistor DM in response to a select signal from the current scan line Sn.

The organic EL diode OLED has a cathode coupled to a reference voltage Vss and emits light corresponding to a current supplied thereto through the driving transistor DM. The reference voltage Vss coupled to the cathode of the organic EL diode OLED is lower than the power supply voltage VDD such that a ground voltage can be used as the reference voltage Vss.

The active matrix pixel circuit described above must include the switching transistor SM that transmits a data signal from a data line in response to a select signal from a scan line. However, leakage current may flow through the switching transistor SM and result in erroneous operation of the pixel circuit. Therefore, a pixel circuit capable of transmitting a data signal without having current leakage is required.

SUMMARY OF THE INVENTION

It is an aspect of the present invention to provide a display device including a pixel circuit that transmits a data signal using switches responding to at least two control signals and a method of driving the display device.

In one embodiment of the present invention, a display device includes a plurality of scan lines, a plurality of data lines, and a plurality of pixel circuits. The scan lines include a first scan line for applying a first select signal and a second scan line for applying a second select signal at timing different from the timing at which the first scan line applies the select signal. The data lines intersect the scan lines and being insulated from the scan lines. The data lines apply data signals. The pixel circuits are respectively coupled to the scan lines and the data lines. Each pixel circuit of the pixel circuits includes first and second switches, a storage element, a first transistor, and a light-emitting element. The first and second switches are coupled in series to a corresponding data line of the data lines. The storage element charges a voltage corresponding to a data signal transmitted from the corresponding data line through the first and second switches. The first transistor outputs a current corresponding to the voltage charged in the storage element. The light-emitting element emits light corresponding to the current output from the first transistor. One of the first and second switches of a first pixel circuit of the pixel circuits coupled to the first scan line is turned on in response to the select signal of the first scan line and the other one of the first and second switches is turned on in response to a first control signal that controls an operation of a second pixel circuit of the pixel circuits coupled to the second scan line.

The second pixel circuit can further include a third switch that is coupled between the light-emitting element and the first transistor and can block the current output from the first transistor. The third switch can be operated in response to the first control signal.

The first control signal can turn off the third switch while the first select signal from the first scan line is supplied to the first pixel circuit.

The third switch can have a channel type different from the channel type of the other one of the first and second switches, which is turned on in response to the first control signal.

The storage element can include a first capacitor charging a voltage corresponding to a threshold voltage of the first transistor, and a second capacitor serially coupled to the first capacitor.

The first and second capacitors are coupled between a gate and a source of the first transistor. The first pixel circuit can further include a fourth switch diode-connecting the first transistor in response to a second control signal and a fifth switch coupled in parallel with the second capacitor and turned on in response to the second control signal.

The second control signal can be a select signal from a third scan line adjacent to the first scan line.

The first control signal can turn off the third switch while the select signals of the first and third scan lines are supplied to the pixel circuit.

In one exemplary embodiment of the present invention, a light-emitting display device includes a plurality of pixel regions including respective light-emitting elements. Each of the pixel regions includes a first electrode, a second electrode, a data electrode, and a first semiconductor layer. The first electrode is extended in a first direction, and applies a select signal. The second electrode is extended in the first direction and applies a control signal. The data electrode is extended in a second direction, intersects the first and second electrodes, being insulated from the first and second electrodes, and applies a data signal representing an image. The first semiconductor layer intersects the first electrode and the second electrode of a pixel region adjacent to the pixel region, being insulated from the first and second electrodes. One end of the first semiconductor layer is electrically coupled to the data electrode through a contact hole.

The light-emitting display further includes at least one first transistor having the one end of the first semiconductor layer. The one end of the first semiconductor layer is a drain electrode or a source electrode of the at least one first transistor, and the first and second electrodes is a gate electrode of one or more transistors.

The light-emitting display further can include a second semiconductor layer insulated from the second electrode and a second transistor having one end of the second semiconductor layer. The one end of the second semiconductor layer can be a drain electrode of the second election, and the second electrode can be a gate electrode of the second transistor. The one end of the second semiconductor layer can be coupled to one electrode of the light-emitting element through a second contact hole.

The first electrode of a first pixel region of the pixel regions adjacent to a second pixel region of the pixel regions can be arranged in close proximity to the second electrode of the second pixel region.

The first and second semiconductors layers can respectively form transistors having different channel types.

The first and second electrodes can serve as a gate electrode of the at least one first transistor.

In one exemplary embodiment of the present invention, a light-emitting display device includes a plurality of scan lines applying select signals, a plurality of data lines applying data signals, and a plurality of pixel circuits respectively coupled to the scan lines and data lines. A first pixel circuit of the pixel circuits includes a light-emitting element, a first transistor, a first switch, a first capacitor, a second capacitor, a second switch, a second transistor, and a third transistor. The light-emitting element emits light corresponding to an applied current applied thereto. The first transistor includes a first electrode, a second electrode coupled to the first electrode, and a third electrode coupled to a first switch, and it outputs the applied current. The applied current corresponds to a voltage applied across the first and second electrodes to the third electrode. The first switch diode-connects the first transistor in response to a first control signal. The first capacitor has a first capacitor electrode that is coupled to the second electrode of the first transistor and a second capacitor electrode. The second capacitor is coupled between the first electrode of the first transistor and the second capacitor electrode of the first capacitor. The second switch is turned on in response to the first control signal to electrically couple the second capacitor electrode of the first capacitor to a power supply. The second transistor applies a data signal applied to a corresponding data line of the data lines in response to a select signal of a corresponding scan line of the scan lines. The third transistor supplies the data signal supplied by the second transistor to the second capacitor electrode of the first capacitor in response to a second control signal.

The second control signal can be a select signal from a scan line of a second pixel circuit of the pixel circuits adjacent to the first pixel circuit.

The light-emitting display can further include a third switch for blocking a current supplied to the light-emitting element in response to a third control signal.

The third control signal can turn off the third switch while select signals from the scan line of the first circuit and the scan line of the second pixel circuit adjacent to the first pixel circuit are being applied.

The third switch can have a channel type different from the channel type of the second transistor.

The second control signal can be a third control signal of the second pixel circuit adjacent to the first pixel circuit. The third control signal of the second pixel circuit can be used to block a current supplied to a light-emitting element of the second pixel circuit.

BRIEF DESCRIPTION OF THE DRAWINGS

The accompanying drawings, together with the specification, illustrate exemplary embodiments of the present invention, and together with the description, serve to explain the principles of the present invention.

DETAILED DESCRIPTION

Figure 1:
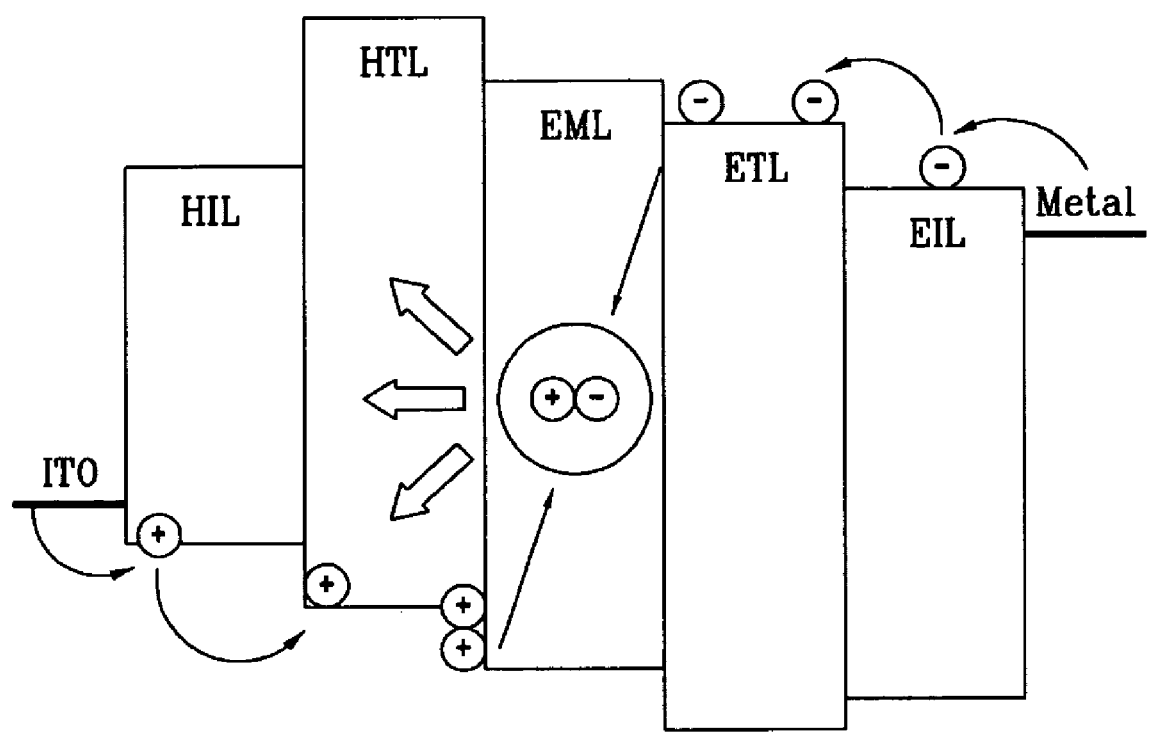
FIG. 1 shows an organic EL device.
Figure 2:
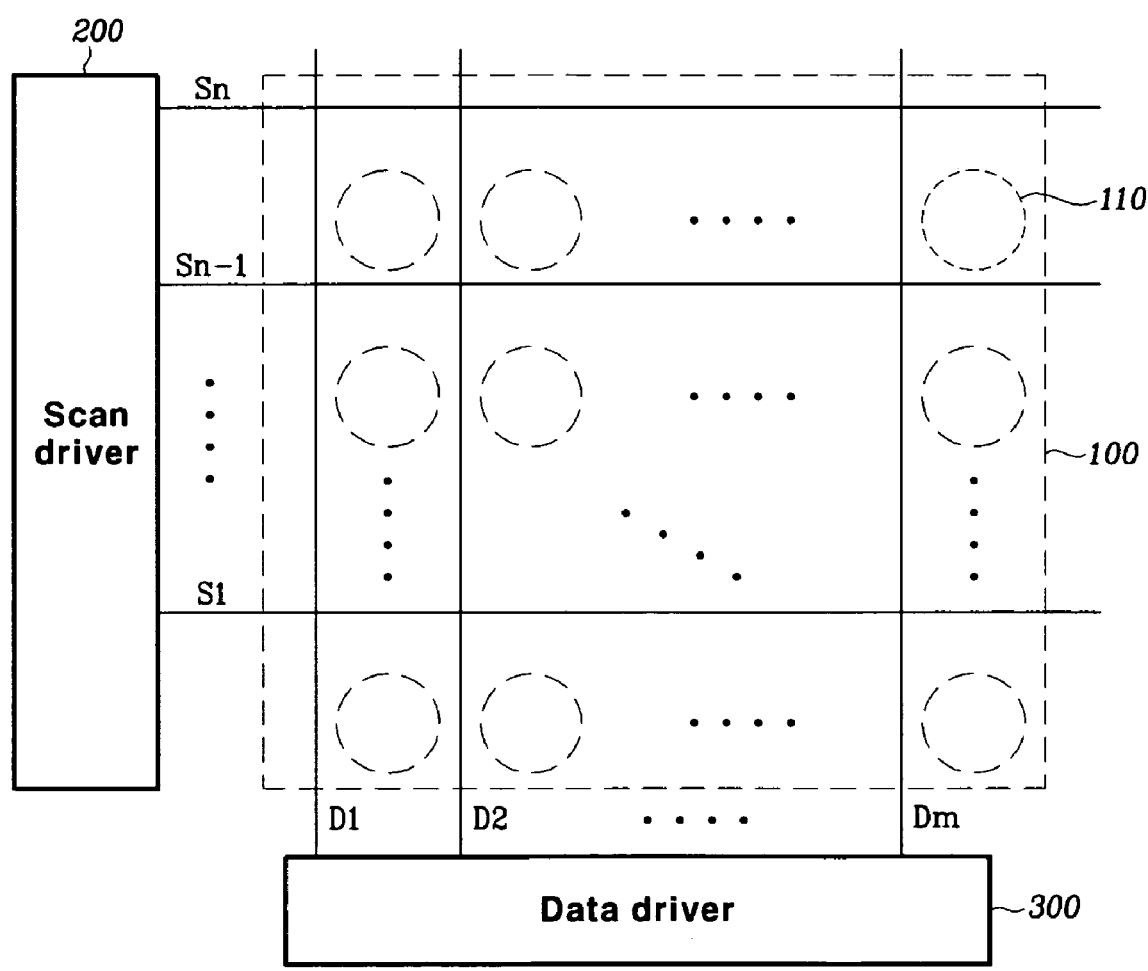
FIG. 2 shows a conventional active matrix organic EL display using TFTs.
Figure 3:
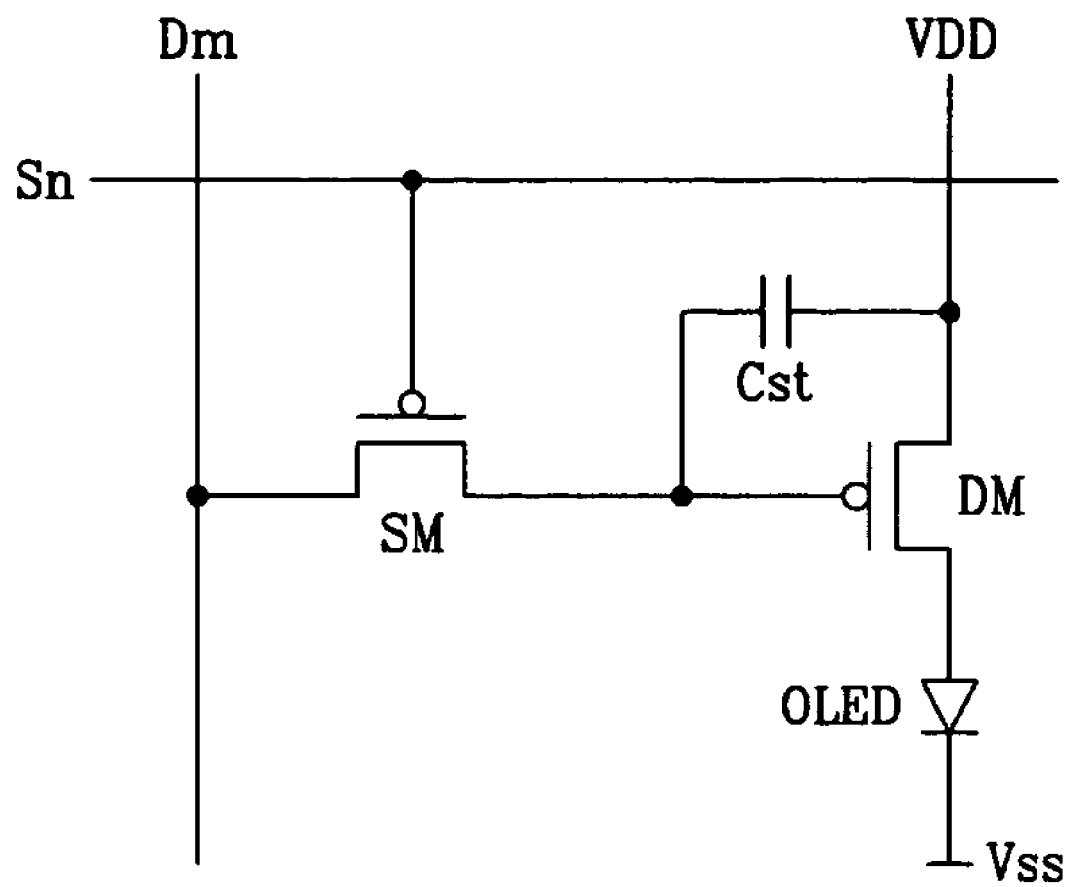
FIG. 3 is a circuit diagram of one of M×N pixel circuits of the display panel 100 shown in FIG. 2.

In the following detailed description, only certain exemplary embodiments of the present invention are shown and described, simply by way of illustration. As those skilled in the art would realize, the described embodiments may be modified in various different ways, all without departing from the spirit or scope of the present invention. Accordingly, the drawings and description are to be regarded as illustrative in nature, and not restrictive. In the context of the present application, to couple one thing to another refers to directly coupling a first thing to a second thing or to couple a first thing to a second thing with a third thing provided therebetween. In addition, when a layer is referred to as being "on" another layer or substrate, it can be directly on the other layer or substrate, or intervening layer(s) or substrate(s) may also be present. Moreover, to clarify the present invention, certain components which are not described in the specification can be omitted, and like reference numerals indicate like components.

In the following, a scan line that transmits a current select signal is referred to as a "current scan line", a scan line that transmits a select signal before the transmission of the current select signal is referred to as a "previous scan line", and a scan line that transmits a select signal after the transmission of the current select signal is referred to as a "next scan line". Furthermore, a cell (e.g., a pixel circuit) that emits light in response to the select signal of the current scan line is referred to as a "current cell", a cell that emits light in response to the select signal of the previous scan line is referred to as a "previous cell", and a cell that emits light in response to the select signal of the next scan line is referred to as a "next cell". Moreover, a light-emitting control line of the current cell is referred to as a "current light-emitting control line", a light-emitting control line of the previous cell is referred to as a "previous light-emitting control line", and a light-emitting control line of the next cell is referred to as a "next light-emitting control line".

Figure 4:
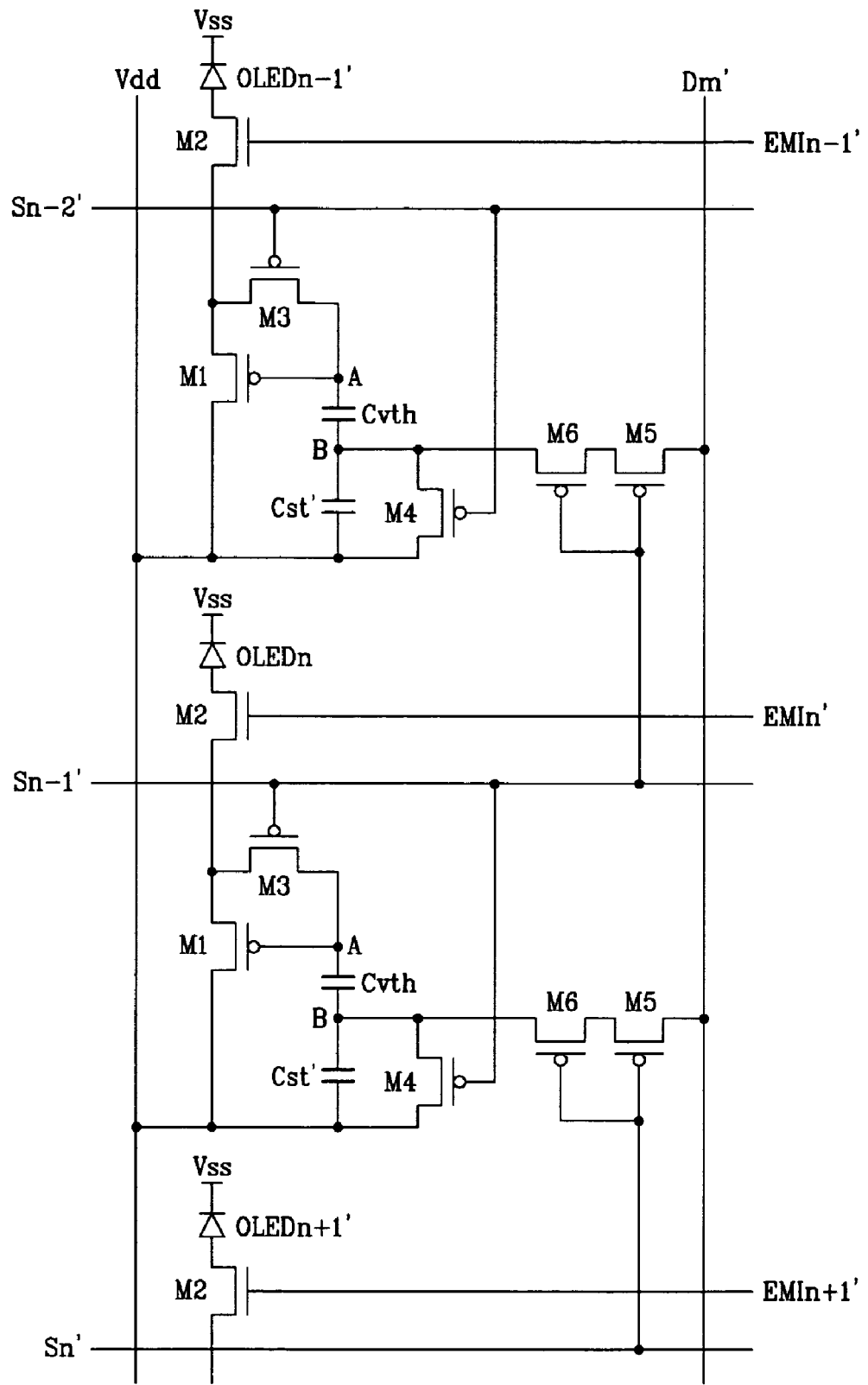
FIG. 4 is an equivalent circuit diagram of an example of a pixel circuit including a dual switching transistor for transmitting a data signal without having current leakage.

FIG. 4 is an equivalent circuit diagram of an exemplary pixel circuit that includes a dual switching transistor for transmitting a data signal without a substantial current leakage. FIG. 4 shows only a pixel circuit coupled to the mth data line Dm', current scan line Sn', and previous scan line Sn-1' for convenience of explanation and the invention is not thereby limited.

As shown in FIG. 4, the pixel circuit includes transistors M1 through M6, capacitors Cst and Cvth, and an organic EL diode OLED (e.g., OLEDn-1', OLEDn', OLEDn+1'). The transistor M1 is a driving transistor for driving the organic EL diode OLED and it is coupled between a power supply voltage Vdd and the organic EL diode OLED. The transistor M1 controls a current flowing to the organic EL diode OLED through the transistor M2 in response to a voltage applied to the gate of the transistor M1.

The gate of the transistor M1 is coupled to a node (or electrode) A of the capacitor Cvth, and the capacitor Cst' and transistor M4 are coupled in parallel between a node (or electrode) B of the capacitor Cvth and the power supply voltage Vdd.

The transistors M5 and M6 transmit a data voltage supplied from the data line Dm to the node B of the capacitor Cvth in response to a select signal from the current scan line Sn'. The transistor M4 directly couples the node B of the capacitor Cvth to the power supply voltage Vdd in response to a select signal from the previous scan line Sn-1'. The transistor M3 diode-connects the transistor M1 in response to the select signal from the previous scan line Sn-1'.

The transistor M2 is coupled between the drain of the transistor M1 and the anode of the organic EL diode OLED and can electrically decouple the drain of the transistor M1 from the organic EL diode OLED in response to a select signal from a light-emitting control line EMln'. The organic EL diode OLED emits light in response to the current supplied thereto through the transistor M2.

Figure 5:
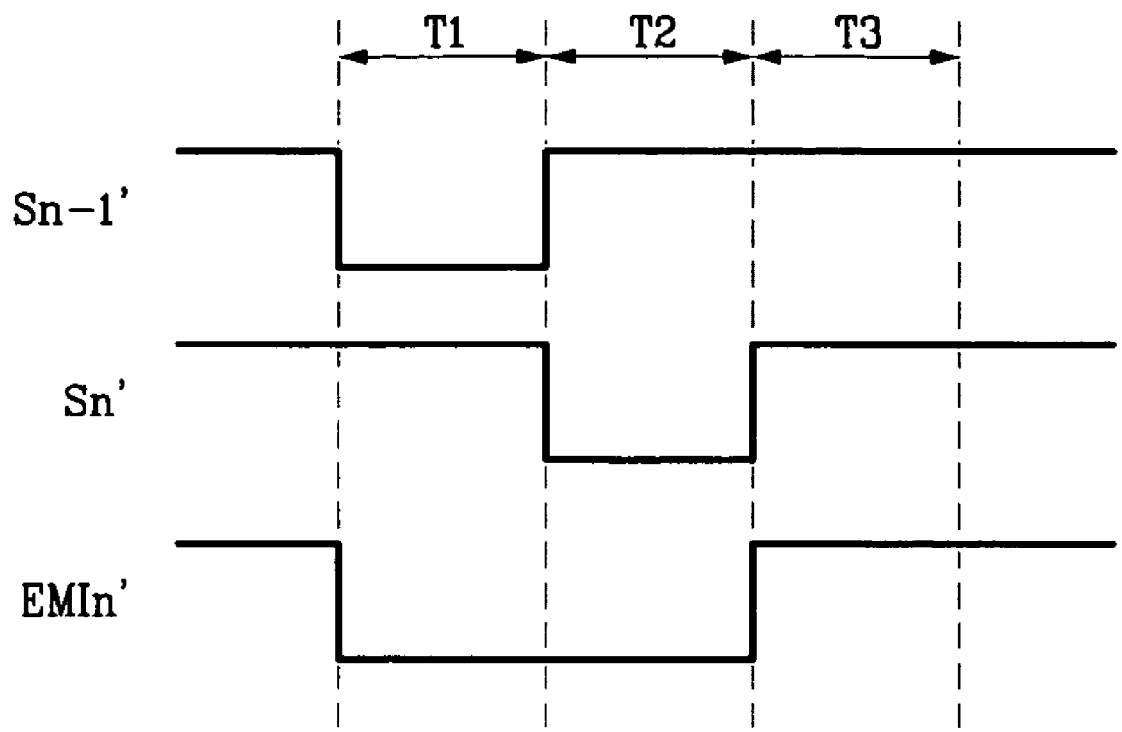
FIG. 5 shows waveforms of signals applied to the pixel circuit of FIG. 4.

The operation of the pixel circuit of FIG. 4 will now be explained with reference to FIG. 5. FIG. 5 shows waveforms of signals applied to the pixel circuit of FIG. 4.

When a low level scan voltage is applied to the previous scan line Sn-1' during an interval T1, the transistor M3 is turned on and thus the transistor M1 is in a diode connection state. Accordingly, a gate-source (or gate to source) voltage of the transistor M1 is varied to be equal to a threshold voltage (Vth) of the transistor M1. Here, the voltage applied to the gate of the transistor M1, that is, the node A of the capacitor Cvth, corresponds to the sum of the power supply voltage Vdd and the threshold voltage (Vth) because the source of the transistor M1 is coupled to the power supply voltage Vdd. Furthermore, the transistor M4 is turned on and thus the power supply voltage Vdd is applied to the node B of the capacitor Cvth. Here, a voltage ($V_{Cvth}$) charged in the capacitor Cvth is represented by the following equation.

$$V_{Cvth} = V_{CvthA} - V_{CvthB} = (Vdd + Vth) - Vdd = Vth \qquad \text{[Equation 1]}$$

Here, $V_{Cvth}$ is referred to as the voltage charged in the capacitor Cvth, $V_{CthA}$ denotes a voltage applied to the node A of the capacitor Cvth, and $V_{CvthB}$ represents a voltage applied to the node B of the capacitor Cvth.

During the interval T1, the transistor M2 having a different channel type from the transistor M3 or an N-type channel is turned off in response to a low-level signal of the light-emitting control line EMln' to prevent the current flowing through the transistor M1 from flowing to the organic EL diode OLED. The transistors M5 and M6 are turned off because the current scan line Sn' is provided with a high-level signal.

When a scan voltage at a low level is applied to the current scan line Sn' during an interval T2, the transistors M5 and M6 are turned on and thus a data voltage (Vdata) is supplied to the node B through the data line Dm'. Furthermore, a voltage corresponding to the sum of the data voltage (Vdata) and the threshold voltage (Vth) of the transistor M1 is supplied to the gate of the transistor M1 because a voltage corresponding to the threshold voltage (Vth) of the transistor M1 is charged in the capacitor Cvth. That is, the gate-source voltage (Vgs) of the transistor M1 is represented by the following Equation 2. Here, the light-emitting control line EMln is provided with a low-level signal to turn off the transistor M2.

$$Vgs = (Vdata + Vth) - VDD \qquad \text{[Equation 2]}$$

During an interval T3, the transistor M2 is turned on in response to a high-level signal of the current light-emitting control line EMln' and a current ($I_{OLED}$) corresponding to the gate-source voltage (Vgs) of the transistor M1 is supplied to the organic EL diode OLED so that the organic EL diode OLED emits light. The current ($I_{OLED}$) is represented by the following Equation 3.

$$I_{OLED} = \frac{\beta}{2}(Vgs - Vth)^2 \quad \text{[Equation 3]}$$

$$= \frac{\beta}{2}((Vdata + Vth - Vdd) - Vth)^2$$

$$= \frac{\beta}{2}(Vdd - Vdata)^2$$

Here, $I_{OLED}$ represents the current flowing through the organic EL diode OLED, Vgs denotes the source-gate voltage of the transistor M1, Vth represents the threshold voltage of the transistor M1, Vdata is referred to as the data voltage, and β is a constant.

As described above, the pixel circuit shown in FIG. 4 can use a dual transistor, that is, the transistors M5 and M6, as a switching transistor (or a switch) for transmitting a data signal from a data line in response to a select signal from a scan line to effectively prevent leakage current from flowing through the switching transistor.

Furthermore, even when respective transistors M1 of respective pixels have different threshold voltages, a deviation among the threshold voltages is compensated for by the capacitor Cvth and thus the current supplied to the organic EL diode OLED becomes uniform. Accordingly, luminance imbalance based on pixel positions can be overcome.

Moreover, since the transistor M2 is turned off during the intervals T1 and T2 to block leakage current from flowing during the period when data is charged, power consumption can be reduced and a black level can be correctly represented.

Figure 6:
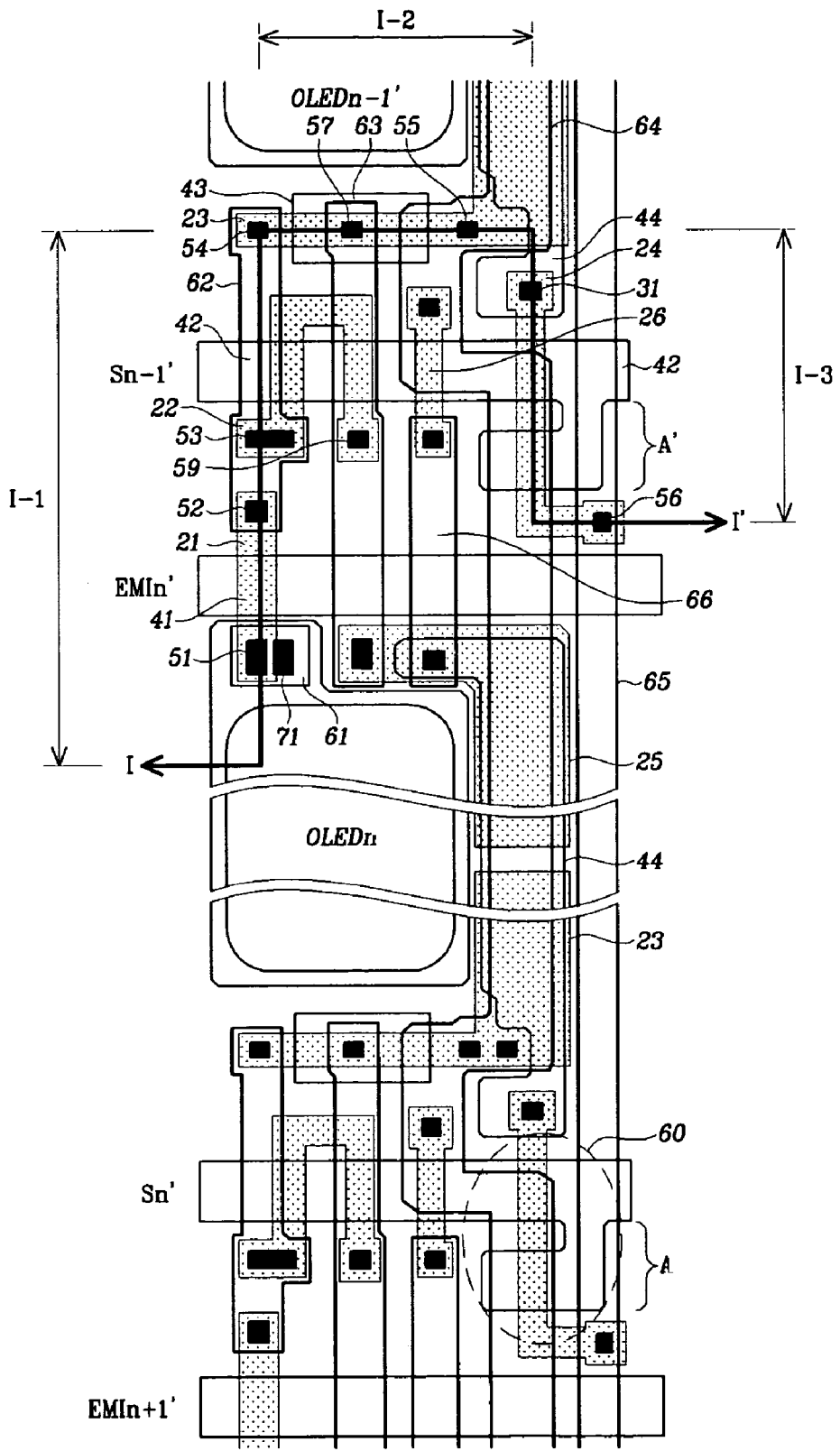
FIG. 6 shows a layout of the pixel circuit of FIG. 4.
Figure 7:
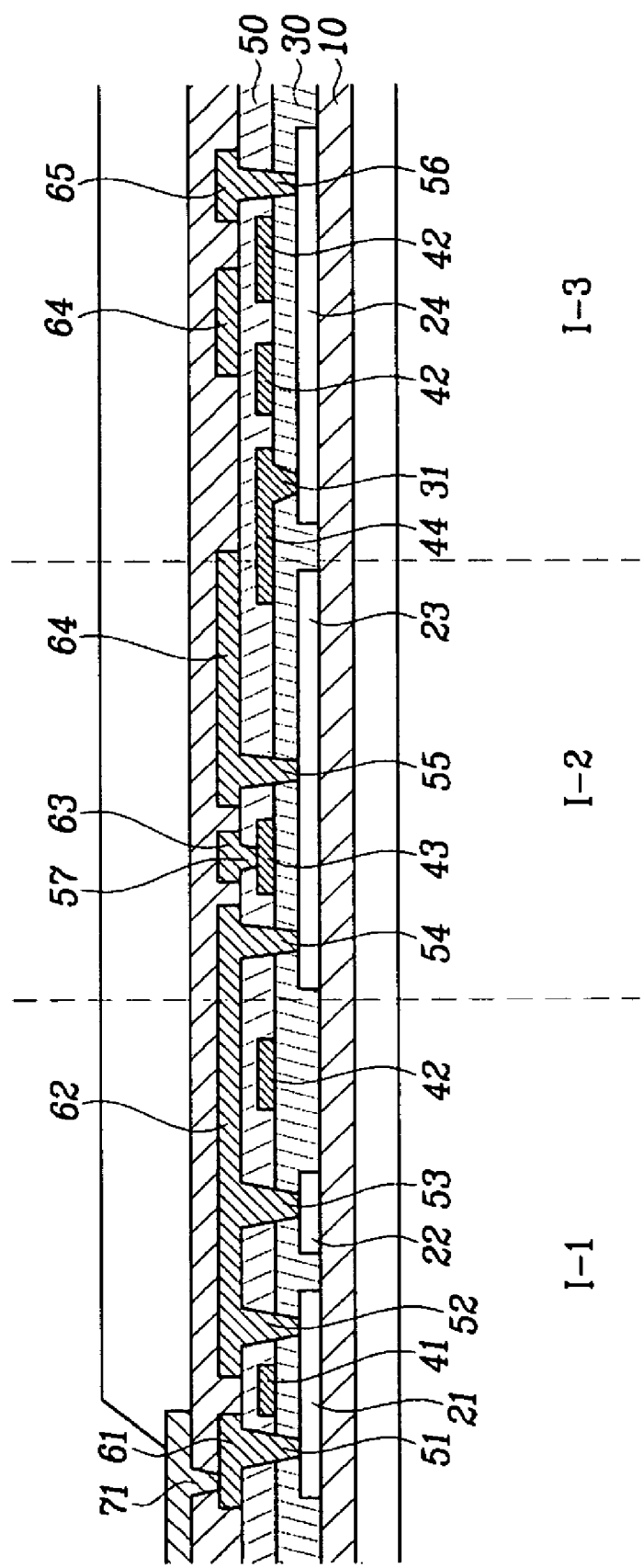
FIG. 7 is a cross-sectional view taken along the line I-I' of FIG. 6.

FIG. 6 shows a layout of the pixel circuit of FIG. 4, and FIG. 7 is a cross-sectional view taken along line I-I' of FIG. 6. Referring to FIGS. 6 and 7, a shielding layer 10 is formed of silicon oxide on an insulating substrate and polysilicon layer patterns 21, 22, 23, 24, 25, and 26 are formed on the shielding layer 10 (shown in FIG. 7).

The polysilicon layer pattern 21 is extended in the vertical direction and forms the channel region of the transistor M2 of the current cell. The polysilicon layer pattern 22 has a shape including two vertical branches and a horizontal part coupling the two vertical branches and forms the channel region of the transistor M3 of the current cell. The polysilicon layer pattern 23 is L-shaped and forms the channel region of the driving transistor M1 of the current cell and one electrode of the capacitor Cst' of the previous cell. The polysilicon layer pattern 24 has an L-shape and forms the channel region of the switching transistors M5 and M6 of the previous cell. The polysilicon layer pattern 25 is L-shaped and forms one electrode of the capacitor Cvth. The polysilicon layer pattern 26 is vertically extended and forms the channel region of the transistor M4 of the current cell.

A gate insulating layer 30 is formed on the polysilicon layer patterns 21, 22, 23, 24, 25, and 26, and gate electrodes are formed on the gate insulating layer 30. Specifically, a gate electrode 42 corresponding to the previous scan line Sn–1', a gate electrode 41 corresponding to the light-emitting control line EMIn', a gate electrode 43 of the driving transistor M1, and an electrode 44 forming one electrode of the capacitors Cst and Cvth are formed on the gate insulating layer.

The gate electrode 42 has a shape including two horizontal branches and forms the gate electrodes of the transistors M3, M4, M5, and M6. The gate electrode 41 is horizontally extended and forms the gate electrode of the transistor M2. One end of the electrode 44 is coupled to the polysilicon layer pattern 24 through a contact hole 31 formed in a predetermined portion of the gate insulating layer 30 and coupled to the drain electrodes of the transistors M5 and M6 of the previous cell. The other end of the electrode 44 forms the node (or electrode) B (shown in FIG. 4) of the capacitors Cst and Cvth of the previous cell.

An interlevel insulating layer 50 is formed on the gate electrodes 41, 42, 43, and 44. An electrode 61, electrode lines 62, 63, and 66, a power line 64 and a data line 65 are formed on the interlevel insulating layer 50. The electrode 61 is coupled to the polysilicon layer pattern 21 through a contact hole 51 formed in a predetermined portion of the gate insulating layer 30 to form the drain electrode of the transistor M2. The electrode line 62 is vertically extended and its bottom end is coupled to the polysilicon layer pattern 21 through a contact hole 52 formed in a predetermined portion of the gate insulating layer 30 to form the source electrode of the transistor M2 and coupled to the polysilicon pattern 22 through a contact hole 53 penetrating a predetermined portion of the interlevel insulating layer 50 and gate insulating layer 30 to form the source electrode of the transistor M3. The top end of the electrode line 62 is coupled to the polysilicon pattern 23 through a contact hole 54 penetrating a predetermined portion of the interlevel insulating layer 50 and gate insulating layer 30 to form the drain electrode of the transistor M1.

The electrode line 63 is vertically extended and its top end is coupled to the polysilicon pattern 23 through a contact hole 57 penetrating a predetermined portion of the gate insulating layer 30 to form the gate electrode of the transistor M1 and coupled to the polysilicon pattern 22 through a contact hole 59 to form the drain electrode of the transistor M3. The bottom end of the electrode line 63 is coupled to the polysilicon pattern 25 through a contact hole penetrating a predetermined portion of the interlevel insulating layer 50 and gate insulating layer 30 to be coupled to the node (or electrode) A (shown in FIG. 4) of the capacitor Cvth of the current cell.

The power line 64 is vertically extended such that it penetrates the previous cell, current cell and next cell. The power line 64 is coupled to the polysilicon pattern 23 through a contact hole 55 penetrating a predetermined portion of the interlevel insulating layer 50 and gate insulating layer 30 to form the source electrode of the transistor M1 and coupled to the polysilicon pattern 26 through a contact hole penetrating a predetermined portion of the interlevel insulating layer 50 and gate insulating layer 30 to form the drain electrode of the transistor M4.

The data line 65 is coupled to the polysilicon pattern 24 through a contact hole 56 penetrating the interlevel insulating layer 50 and gate insulating layer 30 to form the source electrodes of the transistors M5 and M6. The electrode line 66 couples a source region of the polysilicon layer pattern 26 and the gate electrode 44 through a contact hole penetrating the interlevel insulating layer 50 and a contact hole penetrating the interlevel insulating layer 50 and gate insulating layer 30 to form the node (or electrode) B (shown in FIG. 4) of the capacitors Cst' and Cvth of the current cell.

As described above, the pixel circuit of FIG. 4 has the two switching transistors M5 and M6 serially coupled. Thus, the current scan line Sn' is approximately formed in a U-shape 60 having two branches and a part coupling the two branches in order to couple the gate electrodes of the switching transistors M5 and M6 of the current cell to the current scan line Sn'. This requires an additional space A' (shown in FIG. 6) for the current scan line Sn' and results in a decrease in the aperture ratio.

In an enhancement of the pixel circuit of FIG. 6, the present invention provides a pixel circuit including a dual switching transistor, which is able to prevent leakage current from flowing through the switching transistor without decreasing the aperture ratio.

Figure 8:
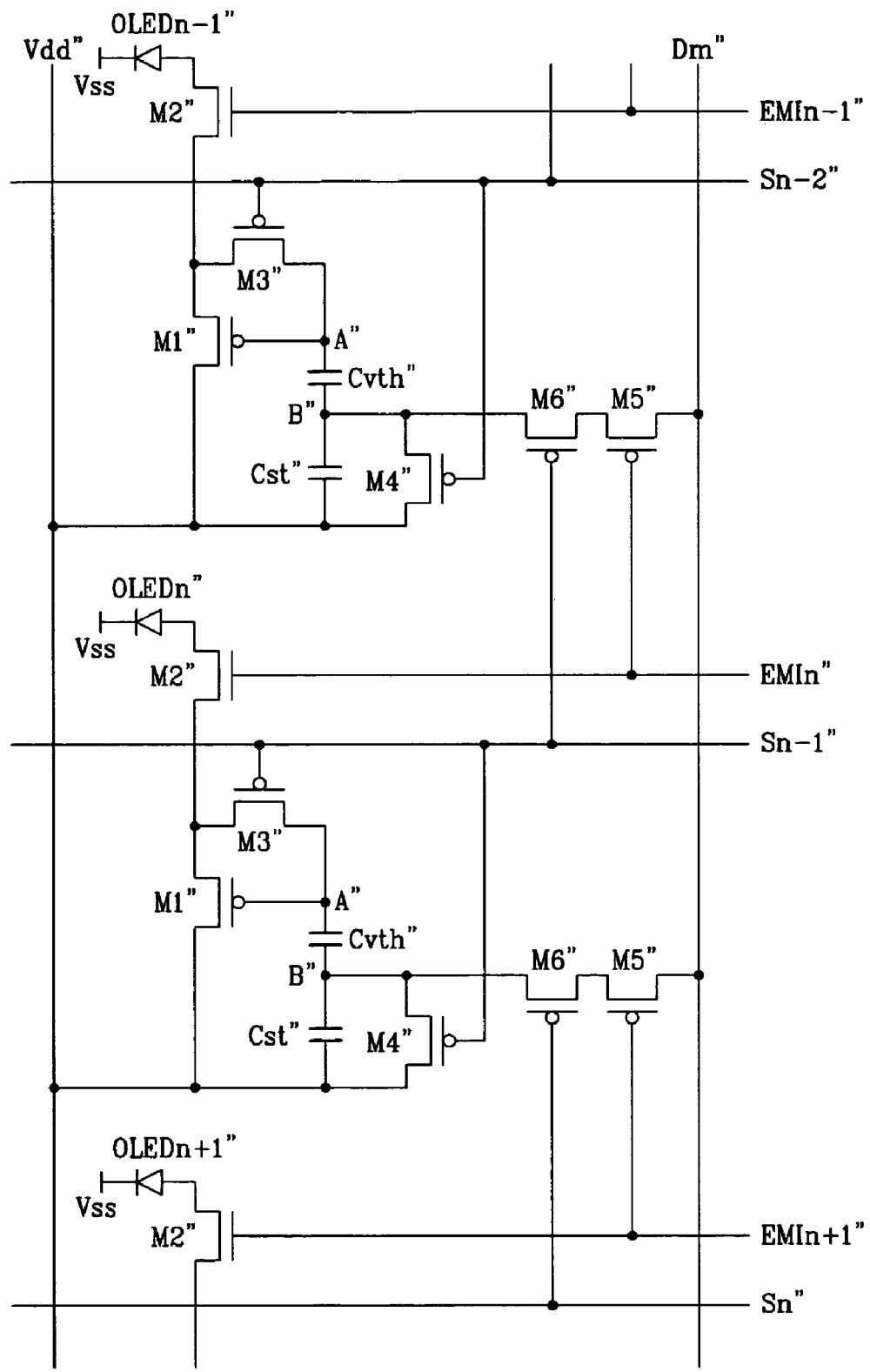
FIG. 8 is an equivalent circuit diagram of a pixel circuit according to an exemplary embodiment of the present invention.

FIG. 8 is an equivalent circuit diagram of a pixel circuit according to an exemplary embodiment of the present invention. The pixel circuit of FIG. 8 is distinguished from the pixel circuit of FIG. 4 in that the switching transistor M6" is operated based on the current scan line Sn" and the switching transistor M5" is operated based on the next light-emitting control line EMln+1".

Referring to FIG. 8, the pixel circuit includes transistors M1" through M6", capacitors Cst" and Cvth", and an organic EL diode OLED. The transistor M1" is a driving transistor for driving the organic EL diode OLED and coupled between a power supply voltage Vdd" and the organic EL diode OLED. The transistor M1" controls a current flowing to the organic EL diode OLED through the transistor M2" in response to a voltage applied to the gate of the transistor M1".

The gate of the transistor M1" is coupled to one electrode (or node) A" of the capacitor Cvth", and the capacitor Cst" and transistor M4" are coupled in parallel between the other electrode (or node) B" of the capacitor Cvth" and the power supply voltage Vdd".

The transistor M5" is operated in response to a select signal from the next light-emitting control line EMln+1" and the transistor M6" is operated in response to a select signal from the current scan line Sn". In addition, the transistors M5" and M6" can be simultaneously turned on to transmit a data voltage supplied from the data line Dm" to the other electrode B" of the capacitor Cvth".

The transistor M4" provides the power supply voltage Vdd" to the electrode B" of the capacitor Cvth" in response to a select signal from the previous scan line Sn−1". The transistor M3" diode-connects the transistor M1" in response to the select signal from the previous scan line Sn−1".

The transistor M2" is coupled between the drain of the transistor M1" and the anode of the organic EL diode OLED and can electrically decouple the drain of the transistor M1" from the organic EL diode OLED in response to a select signal from a light-emitting control line EMln". The organic EL diode OLED emits light in response to the current supplied thereto through the transistor M2".

Figure 9:
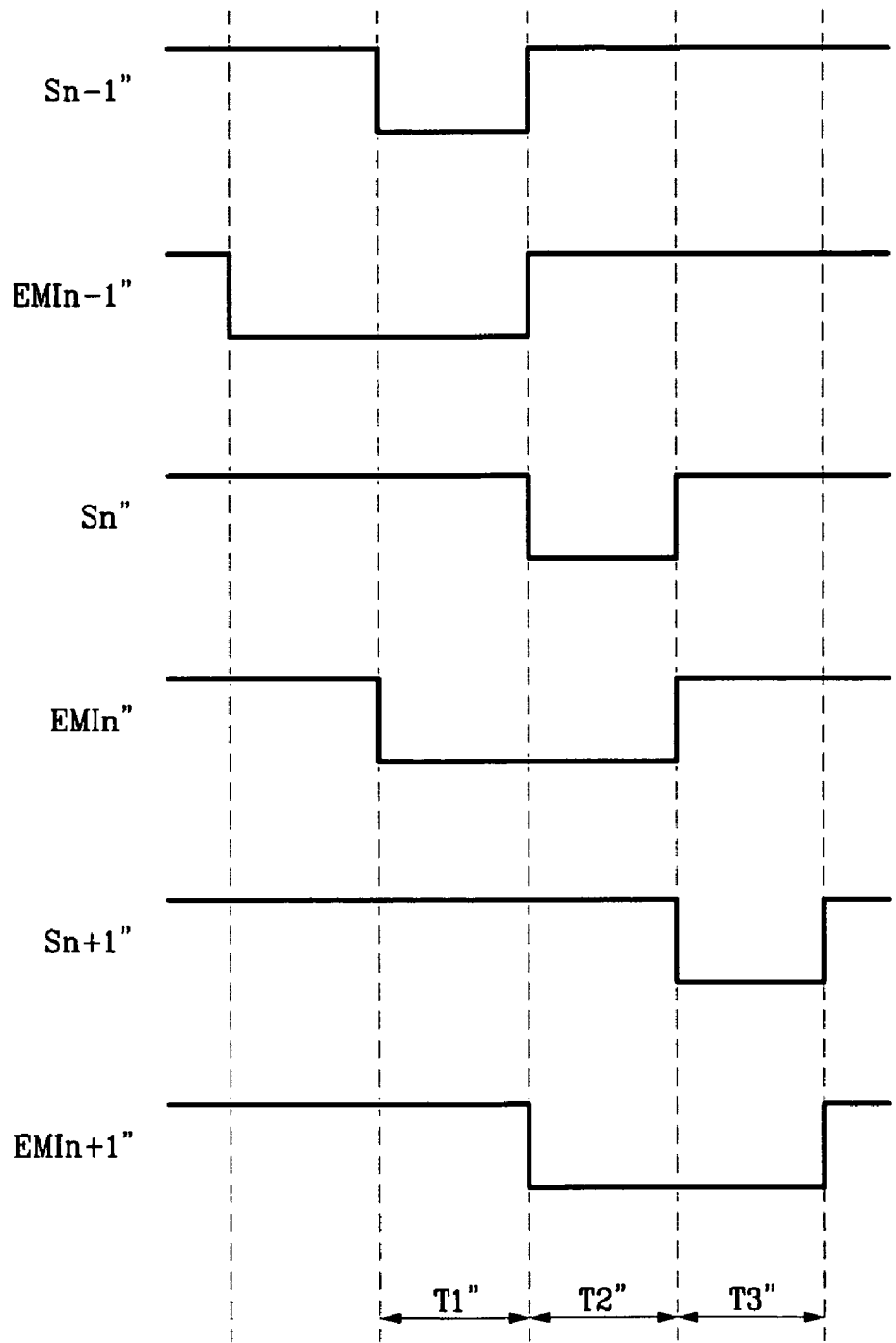
FIG. 9 shows waveforms of signals applied to the pixel circuit of FIG. 8.

The operation of the pixel circuit of FIG. 8 will now be explained in more detail with reference to FIG. 9. FIG. 9 shows waveforms of signals applied to the pixel circuit of FIG. 8.

When a scan voltage having a low level is applied to the previous scan line Sn−1" during an interval T1", the transistor M3" of the current cell is turned on and thus the transistor M1" becomes diode-connected. Accordingly, a gate-source voltage of the transistor M1" is varied to be equal to a threshold voltage (Vth) of the transistor M1". Here, the voltage applied to the gate of the transistor M1", that is, the electrode A" of the capacitor Cvth", corresponds to the sum of the power supply voltage Vdd" and the threshold voltage (Vth) because the source of the transistor M1" is coupled to the power supply voltage Vdd". Furthermore, the transistor M4" is turned on and thus the power supply voltage Vdd" is applied to the electrode B" of the capacitor Cvth" to charge the capacitor Cvth" with a voltage ($V_{Cvth}$ and referring to Equation 1).

During the interval T1", the transistor M2" having an N-type channel is turned off in response to a low-level signal of the current light-emitting control line EMln" to prevent the current flowing through the transistor M1 from flowing to the organic EL diode OLED.

When the current scan line Sn" supplies a low-level signal to the pixel circuit during an interval T2", the switching transistor M6" of the current cell is turned on, and simultaneously, the transistors M3" and M4" of the next cell are turned on. Here, a low-level signal is applied to the next light-emitting control line EMln+1" to turn off the N-type transistor M2" of the next cell in order to prevent the organic EL diode OLED of the next cell from emitting light due to leakage current. In addition, the transistor M5" operated in response to a select signal of the next light-emitting control line EMln+1" is also turned on according to the low level signal that is applied to the next light-emitting control line EMln+1" to turn off the N-type transistor M2" of the next cell. In this manner, the switching transistors M5" and M6" are simultaneously turned on and thus the data voltage (Vdata) is supplied to the node B".

Furthermore, a voltage corresponding to the sum of the data voltage (Vdata) and the threshold voltage (Vth) of the transistor M1" is supplied to the gate of the transistor M1" because a voltage corresponding to the threshold voltage (Vth) of the transistor M1" is charged in the capacitor Cvth". Here, the light-emitting control line EMln" is provided with a low-level signal to turn off the transistor M2".

During an interval T3", the transistor M2" is turned on in response to a high-level signal of the current light-emitting control line EMln" and a current ($I_{OLED}$) corresponding to the gate-source voltage (Vgs) of the transistor M1" is provided to the organic EL diode OLED so that the organic EL diode OLED emits light.

While the transistor M2" is an N-type transistor and the transistor M5" is a P-type transistor in this embodiment, the transistors M2" and M5" can be respectively P-type and N-type transistors and the invention is not thereby limited. Of course, those skilled in the art would recognize that the voltage polarities and levels may be different when other transistor types are used.

As described above, the pixel circuit according to the present invention, shown in FIG. 7, can effectively block leakage current flowing through the switching transistors by using the transistors M5" and M6" that respectively respond to the current scan line and the next light-emitting control line.

Furthermore, even when respective transistors M1" of respective pixels have different threshold voltages, a deviation among the threshold voltages is compensated by the capacitor Cvth" and thus the current supplied to the organic EL diode OLED becomes uniform. Accordingly, luminance imbalance based on pixel positions can be solved.

Moreover, since the transistor M2" is turned off during the intervals T1' and T2' to block leakage current from flowing during the period when data is charged, power consumption can be reduced and a black level can be correctly represented.

Figure 10:
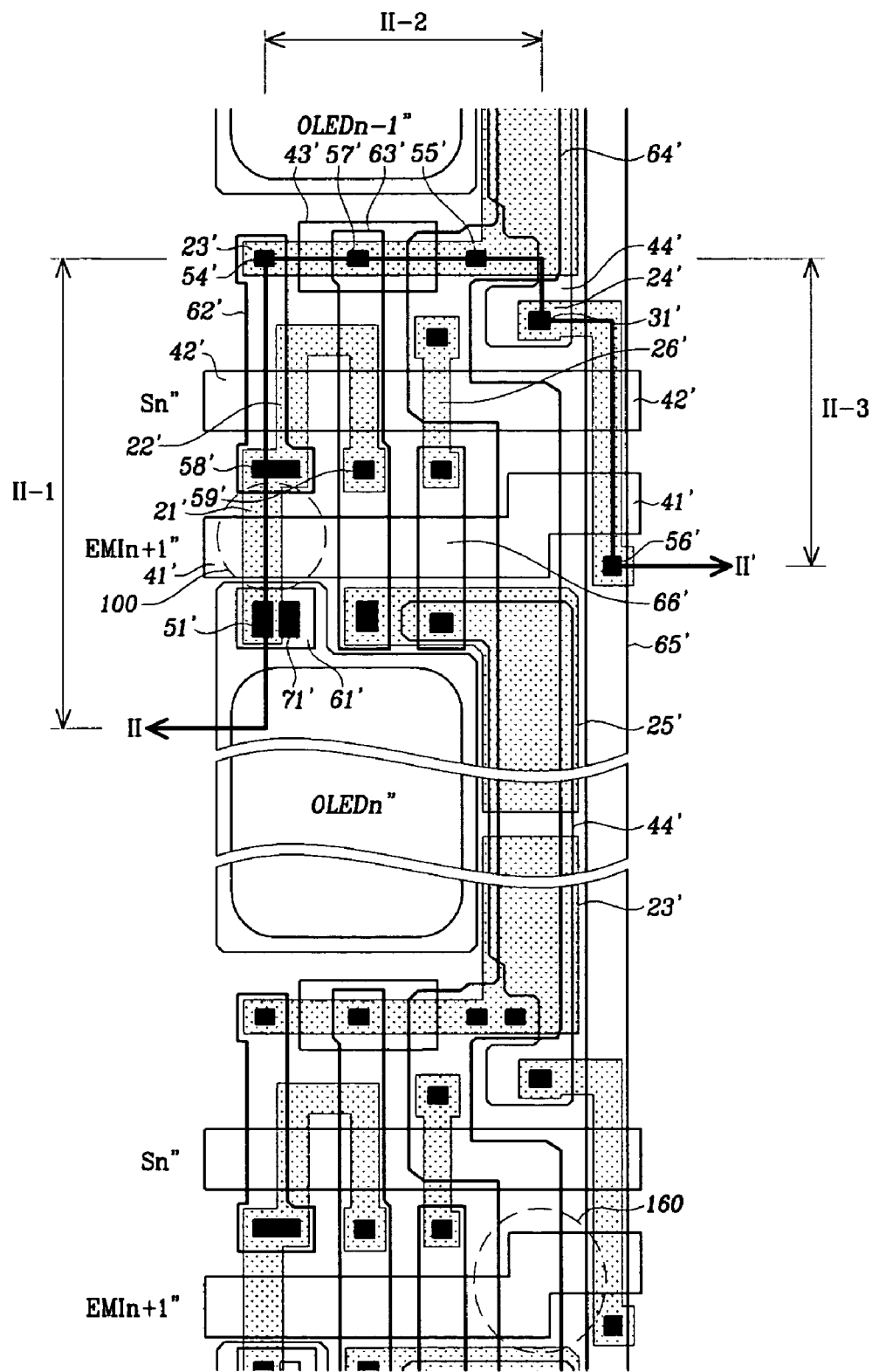
FIG. 10 shows a layout of the pixel circuit of FIG. 8.
Figure 11:
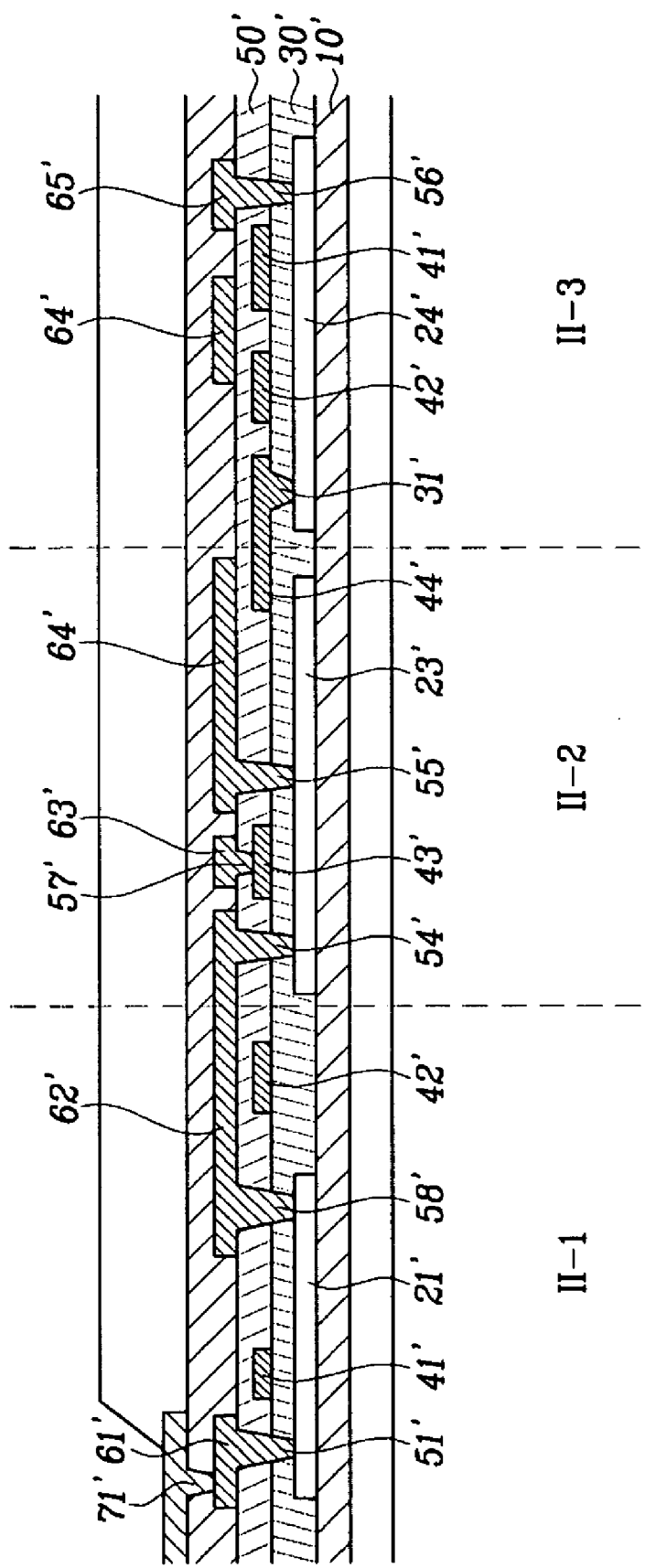
FIG. 11 is a cross-sectional view taken along the line II-II' of FIG. 10.

FIG. 10 shows a layout of the pixel circuit of FIG. 8, and FIG. 11 is a cross-sectional view taken along line II-II' of FIG. 10. Referring to FIGS. 10 and 11, a shielding layer 10 is formed of silicon oxide on an insulating substrate and polysilicon layer patterns 21', 22', 23', 24', 25', and 26' are formed on the shielding layer 10' (shown in FIG. 11).

The polysilicon layer pattern 21' is extended in the vertical direction and forms the channel region of the transistor M2" of the current cell. Here, the polysilicon layer pattern 22' (unlike the polysilicon layer pattern of FIG. 6) is electrically coupled at connection branch 100 to (or formed as a part of) the polysilicon pattern 21' and has a shape including two vertical branches and a horizontal part coupling the two vertical branches and forms the channel region of the transistor M3 of the current cell. The polysilicon layer pattern 23' is L-shaped and forms the channel region of the driving transistor M1" of the current cell and one electrode of the capacitor Cst" of the previous cell. The polysilicon layer pattern 24' has an L-shape (that is oriented differently from the pattern 24 of FIG. 6) and forms the channel region of the switching transistors M5" and M6" of the previous cell. The polysilicon layer pattern 25' is L-shaped and forms one electrode of the capacitor Cvth". The polysilicon layer pattern 26' is vertically extended and forms the channel region of the transistor M4" of the current cell.

A gate insulating layer 30' is formed on the polysilicon layer patterns 21', 22', 23', 24', 25', and 26', and gate electrodes are formed on the gate insulating layer 30'. Specifically, a gate electrode 42' corresponding to the previous scan line Sn−1", a gate electrode 41' corresponding to the light-emitting control line EMln", a gate electrode 43' of the driving transistor M1", and an electrode 44' forming one electrode of the capacitors Cst" and Cvth" are formed on the gate insulating layer.

The gate electrode 42' is horizontally extended and forms the gate electrodes of the transistors M3", M4", and M6". The gate electrode 41' is horizontally extended in the form of a crank 160 and forms the gate electrodes of the transistors M2" and M5". One end of the electrode 44' is coupled to the polysilicon layer pattern 24' through a contact hole 31' penetrating the gate insulating layer 30' to be coupled to the drain electrode of the transistor M6" of the previous cell. The other end of the electrode 44' forms one electrode B" of the capacitors Cst" and Cvth" of the previous cell.

An interlevel insulating layer 50' is formed on the gate electrodes 41', 42', 43', and 44', and an electrode 61', electrode lines 62', 63', and 66', a power line 64' and a data line 65' are formed on the interlevel insulating layer 50'. The electrode 61' is coupled to the polysilicon layer pattern 21' through a contact hole 51' formed in a predetermined portion of the gate insulating layer 30' to form the drain electrode of the transistor M2".

The electrode line 62' is vertically extended and its bottom end is coupled to the polysilicon layer patterns 21' and 22' through a contact hole 58' penetrating the interlevel insulating layer 50' and gate insulating layer 30' to commonly form the source electrodes of the transistors M2" and M3". The top end of the electrode line 62' is coupled to the polysilicon pattern 23' through a contact hole 54' penetrating a predetermined portion of the interlevel insulating layer 50' and gate insulating layer 30' to form the drain electrode of the transistor M1".

The electrode line 63' is vertically extended and its top end is coupled to the polysilicon pattern 23' through a contact hole 57' penetrating a predetermined portion of the gate insulating layer 30' to form the gate electrode of the transistor M1" and coupled to the polysilicon pattern 22' through a contact hole 59' to form the drain electrode of the transistor M3". The bottom end of the electrode line 63' is coupled to the polysilicon pattern 25' through a contact hole penetrating a predetermined portion of the interlevel insulating layer 50' and gate insulating layer 30' to be coupled to the electrode A" of the capacitor Cvth" of the current cell.

The power line 64' is vertically extended such that it penetrates the previous cell, current cell, and next cell. The power line 64' is coupled to the polysilicon pattern 23' through a contact hole 55' penetrating the interlevel insulating layer 50' and gate insulating layer 30' to form the source electrode of the transistor M1" and coupled to the polysilicon pattern 26' through a contact hole penetrating the interlevel insulating layer 50' and gate insulating layer 30' to form the drain electrode of the transistor M4".

The data line 65' is coupled to the polysilicon pattern 24' through a contact hole 56' penetrating the interlevel insulating layer 50' and gate insulating layer 30' to form the source electrodes of the transistors M5" and M6". The electrode line 66' couples a source region of the polysilicon layer pattern 26' and the gate electrode 44' through a contact hole penetrating the interlevel insulating layer 50' and a contact hole penetrating the interlevel insulating layer 50' and gate insulating layer 30' to form the electrode B of the capacitors Cst" and Cvth" of the current cell.

As described above, the two switching transistors M5" and M6" are serially coupled and their gate electrodes are respectively coupled to the next light-emitting control line EMln+1" and the current scan line Sn". Accordingly the additional space (e.g., the space A') (shown in FIG. 6) is not required so that the aperture ratio is increased.

In view of the foregoing, an exemplary embodiment of the present invention provides two switching transistors (e.g., the transistors M5" and M6") that are serially coupled and their gate electrodes are respectively coupled to the next light-emitting control line EMln+1 and the current scan line Sn so that a space occupied by the scan line is reduced and thus the aperture ratio is increased. Furthermore, an exemplary embodiment of the present invention can effectively block leakage current that may flow through the switching transistors by using the transistors (e.g., the transistors M5" and/or M6") respectively responding to the next light-emitting control line and the current scan line.

Moreover, even when respective transistors (e.g., the transistors M1 and/or M1") of pixels have different threshold voltages, a deviation among the threshold voltages is compensated by the capacitor (e.g., the capacitor Cvth and/or Cvth") and thus the current supplied to the organic EL diode (e.g., the diode OLED and/or OLED) becomes uniform. Accordingly, luminance imbalance based on pixel positions can be solved. Furthermore, since the transistor (e.g., the transistor M2' and/or M2") is turned off during the intervals (e.g., the intervals T1, T2, T1' and/or T') to block leakage current from flowing during the period when data is charged, power consumption can be reduced and black can be correctly represented.

While this invention has been described in connection with certain exemplary embodiments, it is to be understood that the invention is not limited to the disclosed embodiments, but, on the contrary, is intended to cover various modifications included within the spirit and scope of the appended claims, and equivalents thereof.

What is claimed is:

1. A display device comprising a plurality of scan lines including first and second scan lines for applying select signals, a plurality of data lines crossing the scan lines and for applying data signals, and a plurality of pixel circuits respectively coupled to the scan lines and the data lines, wherein each pixel circuit of the pixel circuits comprises:
first and second switches serially coupled to a corresponding data line of the data lines;
a storage element for charging a voltage corresponding to a data signal applied from the corresponding data line through the first and second switches;
a first transistor for outputting a current corresponding to the voltage charged in the storage element;
a third switch for blocking current output from the first transistor, the third switch having a first electrode coupled to a light-emitting element and a second electrode coupled to the first transistor; and
the light-emitting element for emitting light information corresponding to the current output from the first transistor, wherein one of the first and second switches of a first pixel circuit of the pixel circuits coupled to the first scan line is turned on in response to a select signal of the first scan line and wherein the other one of the first and second switches is turned on in response to a first control signal for controlling an operation of a second pixel circuit of the pixel circuits coupled to the second scan line, the first control signal overlapping the select signal and having a pulse width different than a pulse width of the select signal, wherein the third switch of the second pixel circuit is operated in response to the first control signal.

2. The display device of claim 1, wherein the first control signal turns off the third switch of the second pixel circuit while the select signal of the first scan line is supplied to the first pixel circuit.

3. The display device of claim 1, wherein the third switch has a channel type different from the channel type of the other one of the first, and second switches, which is turned on in response to the first control signal.

4. The display device of claim 1, wherein the storage element includes a first capacitor for charging a voltage corresponding to a threshold voltage of the first transistor and a second capacitor serially coupled to the first capacitor.

5. The display device of claim 4, wherein the first and second capacitors are coupled between a gate and a source of the first transistor, and the first pixel circuit further comprises a fourth switch for diode-connecting the first transistor in response to a second control signal and a fifth switch coupled in parallel with the second capacitor and turned on in response to the second control signal.

6. The display device of claim 5, wherein the second control signal is a select signal from a third scan line adjacent to the first scan line.

7. The display device of claim 6, wherein the first control signal turns off the third switch of the second pixel circuit while the select signals of the first and third scan lines are supplied to the first pixel circuit.

8. The display device of claim 1, wherein the data lines are insulated from the scan lines.

9. The display device of claim 1, wherein the pulse widths of the respective signals are defined by a first edge of the respective signals, the first edge comprising one of a rising edge or a falling edge, and a second edge of the respective signals adjacent to the first edge, the second edge comprising the other one of the rising edge or the falling edge.

10. The display device of claim 1, wherein the pulse width of the first control signal is configured to have a greater duration than the pulse width of the select signal.

11. The display device of claim 10, wherein the pulse width of the first control signal is configured to have a duration at least two times greater than the pulse width of the select signal.

12. A display device including a plurality of scan lines for applying select signals, a plurality of data lines for applying data signals, and a plurality of pixel circuits respectively coupled to the scan lines and data lines, each pixel circuit of the pixel circuits comprising:

a light-emitting element for emitting light corresponding to an applied current applied thereto;

a first transistor including a first electrode, a second electrode coupled to the first electrode, and a third electrode coupled to a first switch, the first transistor for outputting the applied current, the applied current corresponding to a voltage applied across the first and second electrodes to the third electrode;

the first switch for diode-connecting the first transistor in response to a first control signal;

a first capacitor having a first capacitor electrode coupled to the second electrode of the first transistor and a second capacitor electrode;

a second capacitor coupled between the first electrode of the first transistor and the second capacitor electrode of the first capacitor;

a second switch configured to turn on in response to the first control signal to electrically couple the second capacitor electrode of the first capacitor to a power supply continuously while the first control signal is being applied;

a second transistor for supplying a data signal applied to a corresponding data line of the data lines in response to a second control signal; and a third transistor for supplying the data signal supplied by the second transistor to the second capacitor electrode of the first capacitor in response to a select signal of a corresponding scan line of the scan lines, wherein the first control signal for controlling the first switch to diode-connect the first transistor of a second pixel circuit of the pixel circuits is the select signal of the corresponding scan line of a first pixel circuit of the pixel circuits adjacent to the second pixel circuit.

13. The display device of claim 12, wherein the second control signal is a select signal from a scan line of the second pixel circuit adjacent to the first pixel circuit.

14. The display device of claim 13, further comprising a third switch for blocking a current supplied to the light-emitting element in response to a third control signal.

15. The display device of claim 14, wherein the third control signal turns off the third switch while select signals from the scan line of the first pixel circuit and the scan line of the second pixel circuit are being applied.

16. The display device of claim 14, wherein the third switch has a channel type different from the channel type of the second transistor.

17. The display device of claim 14, wherein the second control signal is a third control signal of the second pixel circuit.

18. The display device of claim 17, wherein the third control signal of the second pixel circuit is for blocking a current supplied to a light-emitting element of the second pixel circuit.

19. A display device comprising:

a scan line for applying a select signal;

a control line for applying a control signal, the control signal overlapping the select signal and having a pulse width different than a pulse width of the select signal;

a data line for applying a data signal, the data line crossing the scan line and the control line;

first and second transistors serially coupled to the data line;

a storage element for storing a voltage corresponding to the data signal applied from the data line through the first and second transistors when the first and second transistors are turned on;

a third transistor for outputting a current corresponding to the voltage stored in the storage element;

a first light-emitting element for emitting light corresponding to the current output from the third transistor and a second light-emitting element adjacent to the first light-emitting element, wherein the first transistor is coupled to the scan line and is turned on in response to the select signal from the scan line and the second transistor is turned on in response to the control signal from the control line, and wherein the control signal further controls an operation of a fourth transistor for blocking a leakage current from reaching the second light-emitting element, 20. The display device of claim 19, further comprising a compensation device serially coupled to the storage element and for compensating a deviation of a threshold voltage.

21. A pixel circuit comprising:

first and second switching transistors for applying a data signal from a data line and for blocking a leakage current from the data line;

a storage capacitor for storing a voltage corresponding to the data signal from the data line applied through the first and second transistors when the first and second transistors are turned on;

a driving transistor for outputting a current corresponding to the voltage stored in the storage element; and a first light-emitting element for displaying information corresponding to the current output from the driving transistor, wherein the first switching transistor is turned on in response to a select signal from a scan line and the second switching transistor is turned on in response to a control signal from a control line, the control signal overlapping the select signal and having a pulse width different than a pulse width of the select signal, wherein the control signal further controls an operation for blocking a leakage current from reaching a second light-emitting element of another pixel circuit adjacent to the pixel circuit.

22. The pixel circuit of claim 21, wherein the another pixel circuit comprises a third switching transistor and the second light-emitting element, wherein the control signal controls an operation of the third switching transistor, and wherein the third switching transistor is for blocking the leakage current from reaching the second light-emitting element.

23. The pixel circuit of claim 21, further comprising a compensation capacitor serially coupled to the storage capacitor and for providing a uniformity effect to the current output from the driving transistor.

* * * * *